(12) United States Patent
Fang et al.

(10) Patent No.: US 9,564,331 B2
(45) Date of Patent: Feb. 7, 2017

(54) APPARATUS AND METHOD FOR ROUNDED ONO FORMATION IN A FLASH MEMORY DEVICE

(75) Inventors: Shenqing Fang, Fremont, CA (US); Tung-Sheng Chen, Cupertino, CA (US); Tim Thurgate, Sunnyvale, CA (US); Di Li, Highland, CA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 38 days.

(21) Appl. No.: 13/540,373

(22) Filed: Jul. 2, 2012

(65) Prior Publication Data

US 2014/0001534 A1    Jan. 2, 2014

(51) Int. Cl.
| | | |
|---|---|---|
| *H01L 29/792* | (2006.01) | |
| *H01L 21/28* | (2006.01) | |
| *H01L 29/66* | (2006.01) | |
| *H01L 27/115* | (2006.01) | |
| *H01L 21/762* | (2006.01) | |

(52) U.S. Cl.
CPC ... *H01L 21/28282* (2013.01); *H01L 21/76224* (2013.01); *H01L 27/11568* (2013.01); *H01L 29/66833* (2013.01); *H01L 29/792* (2013.01)

(58) Field of Classification Search
CPC .............. H01L 21/28282; H01L 29/66833; H01L 29/792; H01L 29/42348; H01L 21/762
See application file for complete search history.

(56) References Cited

U.S. PATENT DOCUMENTS

| | | | | |
|---|---|---|---|---|
| 6,127,698 A | * | 10/2000 | Wu | .......... H01L 21/28194 257/30 |
| 2008/0265301 A1 | * | 10/2008 | Fang et al. | ............. 257/315 |
| 2009/0269918 A1 | * | 10/2009 | Ma et al. | ............. 438/591 |
| 2009/0323411 A1 | | 12/2009 | Bach | |
| 2010/0133646 A1 | | 6/2010 | Fang et al. | |
| 2010/0276746 A1 | * | 11/2010 | Fang et al. | ............. 257/324 |
| 2011/0199819 A1 | | 8/2011 | Fang et al. | |
| 2011/0244650 A1 | * | 10/2011 | Ema et al. | ............. 438/427 |

FOREIGN PATENT DOCUMENTS

| | | |
|---|---|---|
| KR | 1020080102030 A | 11/2008 |
| KR | 1020090091560 A | 8/2009 |

OTHER PUBLICATIONS

International Search Report for International Application No. PCT/US2013/049054 dated Oct. 18, 2013; 3 pages.
Written Opinion of the International Searching Authority for International Application No. PCT/US2013/049054 mailed Oct. 18, 2013; 7 pages.

* cited by examiner

Primary Examiner — Jae Lee

(57) ABSTRACT

A method and apparatus for continuously rounded charge trapping layer formation in a flash memory device. The memory device includes a semiconductor layer, including a source/drain region. An isolation region is disposed adjacent to the source/drain region. A first insulator is disposed above the source/drain region. A charge trapping layer is disposed within the first insulator, wherein the charge trapping layer comprises a bulk portion and a first tip and a second tip on either side of said bulk portion, wherein said charge trapping layer extends beyond the width of the source/drain region. A second insulator is disposed above the charge trapping layer. A polysilicon gate structure is disposed above the second insulator, wherein a width of said control gate is wider than the width of said source/drain region.

7 Claims, 10 Drawing Sheets

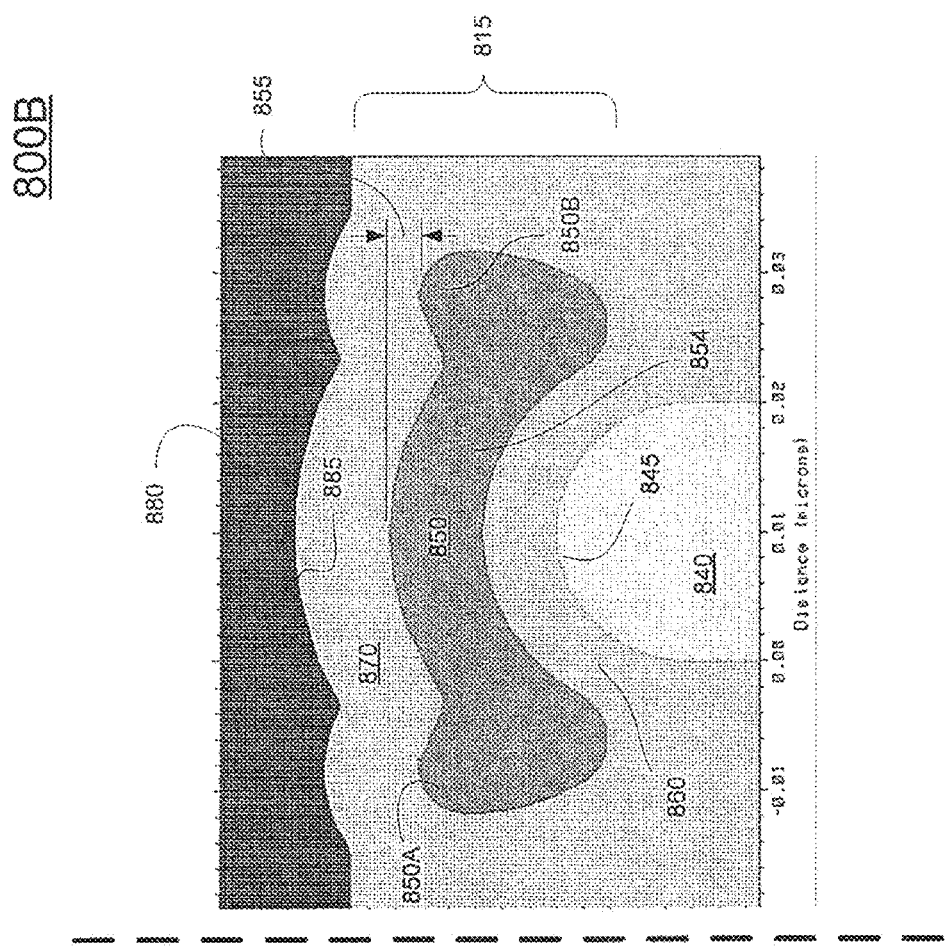
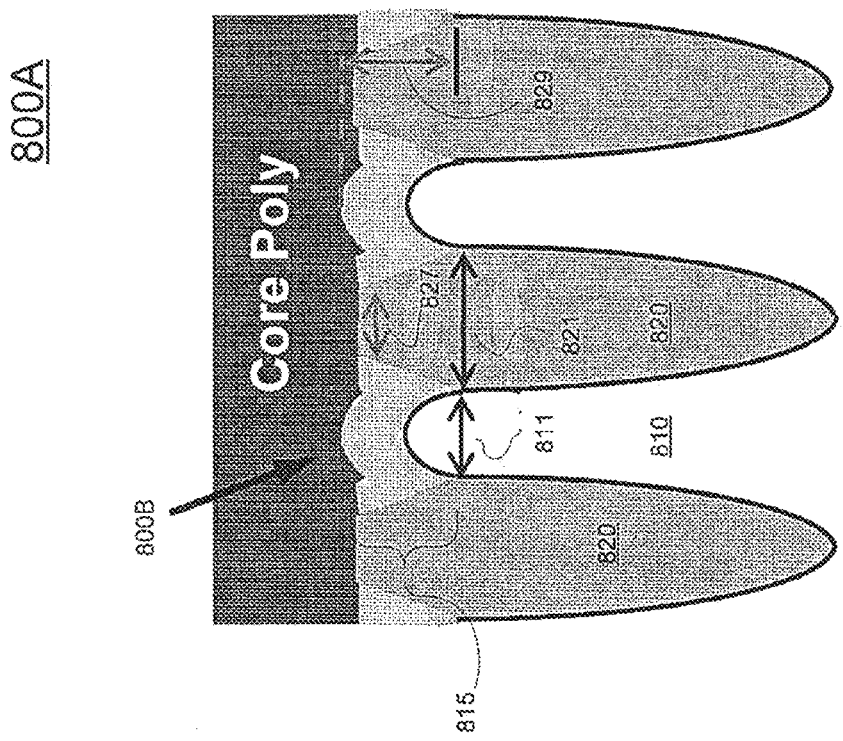
FIG. 8B
FIG. 8A

APPARATUS AND METHOD FOR ROUNDED ONO FORMATION IN A FLASH MEMORY DEVICE

TECHNICAL FIELD

The invention is related to computer-readable memory.

BACKGROUND OF THE INVENTION

Various types of electronic memory have been developed in recent years. Some exemplary memory types are electrically erasable programmable read only memory (EEPROM) and electrically programmable read only memory (EPROM). EEPROM is easily erasable but lacks density in storage capacity, whereas EPROM is inexpensive and denser but is not easily erased. "Flash" EEPROM, or Flash memory, combines the advantages of these two memory types. This type of memory is used in many electronic products, from large electronics like cars, industrial control systems, and etc. to small portable electronics such as laptop computers, portable music players, cell phones, and etc.

Flash memory is typically made up of an array of floating gate transistors, commonly referred to as memory "cells." One or more bits of data are stored as charge by each memory cell. For example, dual bit memory devices use a silicon-oxide-nitride-oxide-silicon (SONOS) type architecture in which a lower layer of silicon oxide is formed over a semiconductor substrate that is typically silicon. A layer of silicon nitride is formed on the lower layer of silicon oxide, an upper layer of silicon oxide is formed on the layer of silicon nitride and a layer of an electrically conductive material is formed on the upper layer of silicon oxide. The combination of the lower silicon oxide layer, the silicon nitride layer, and the upper silicon oxide layer are capable of trapping charge and are commonly referred to as a charge trapping dielectric structure. It should be noted that the charge trapping structure is defined as an ONO stack. When more than one bit of information is stored in the charge trapping structure, the memory device is referred to as a dual bit memory device. Bit lines are typically formed in the portion of the semiconductor substrate that is below the charge trapping structure and word lines may be formed from the layer of electrically conductive material that is disposed on the charge trapping structure. In a dual bit memory device, two bits are stored per cell by biasing the bit line, the word line, the source, and the drain of the memory cell such that a bit and a complementary bit are stored. This arrangement enables flash memory cells to be manufactured efficiently and economically.

FIG. 1 shows a conventional memory cell. In a conventional flash memory fabrication process, the tunnel oxide, the charge-trapping layer, and top charge block oxide 101 (e.g., oxide-nitride-oxide ONO layer) and one or more polysilicon layers 102 are formed before the shallow trench isolation (STI 103) definition. It should be noted that the nitride layer can be comprised of nitride, silicon rich nitride, a combination of nitride on top of silicon rich nitride or multiple layers with different percentages of silicon content. After the STI 103 formation, another polysilicon layer can be deposited on the previous polysilicon layer. Subsequently, the word line is defined. Unfortunately, this conventional approach produces sharp corners 104-105 because the nature of the STI process produces near vertical sides. These sharp corners directly contribute to device degradation in performance and reliability.

SUMMARY OF THE INVENTION

Accordingly, a need exists for memory devices and methods for manufacturing such devices that exhibit increased program and erase performance. In particular, a need exists for improving gate controllability as memory devices are scaled beyond the 4× technology node. In addition, a need exists for reducing back gate injection during an erase operation as devices are scaled beyond the 4× technology node.

A method and apparatus for charge trap layer profile formation in a flash memory device. The memory device includes a semiconductor layer, including a source/drain region. An isolation region is disposed adjacent to the source/drain region. A first insulator is disposed above the source/drain region. A charge trapping layer is disposed within the first insulator, wherein the charge trapping layer includes a bulk portion conforming to the first insulator and tips on either side of the bulk portion, and wherein the charge trapping layer extends beyond the width of the source/drain region. A second insulator is disposed above the charge trapping layer. A polysilicon gate structure is disposed above the second insulator, wherein a width of the gate is wider than the width of the source/drain region.

In another embodiment, a method for manufacturing a memory device with a charge trapping layer that extends beyond a width of an active region is disclosed. A shallow trench isolation (STI) process is performed before any charge trapping and top-level layers are formed. In particular, the STI process is performed on a semiconductor material to form a source/drain region and an isolation region. A charge trapping layer is disposed over the active region, wherein the charge trapping layer includes a bulk portion and tips on either side of the bulk portion, wherein the charge trapping layer extends beyond the width of the source/drain region. A layer is formed of semiconductor or conductive material as a gate over the charge trapping layer, wherein a width of the gate is wider than the width of the source/drain region.

In still another embodiment, a memory device includes a semiconductor layer including a source/drain region, wherein a top surface of the source/drain region is rounded. The memory device includes an isolation region that is disposed adjacent to the source/drain region. A first insulator is disposed above the source/drain region, and is rounded in conformance with the source/drain region. A charge trapping layer is disposed within the insulator, wherein the charge trapping layer is rounded in conformance with the first insulator. A second insulator is disposed above the charge trapping layer, and is rounded in conformance with the charge trapping layer. A polysilicon gate structure is disposed above the second insulator and includes an obtuse bottom profile, wherein the bottom profile is rounded in conformance with a profile of the first insulator, the charge trapping layer, and the second insulator.

BRIEF DESCRIPTION OF THE DRAWINGS

The present invention is illustrated by way of example, and not by way of limitation, in the figures of the accompanying drawings and in which like reference numerals refer to similar elements.

PRIOR ART

FIGS. 8A-B are diagrams of memory cells including a curved or rounded core source/drain region, in accordance with embodiments of the present disclosure.

DETAILED DESCRIPTION OF THE INVENTION

Reference will now be made in detail to embodiments of the present invention, examples of which are illustrated in the accompanying drawings. While the present invention will be discussed in conjunction with the following embodiments, it will be understood that they are not intended to limit the present invention to these embodiments alone. On the contrary, the present invention is intended to cover alternatives, modifications, and equivalents which may be included with the spirit and scope of the present invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention. For instance, in order to avoid obscuring the present invention, some well-known system configurations and process steps are not disclosed in detail. Likewise, the drawings showing embodiments of the invention are semi-diagrammatic and not drawn to scale, and particularly, some of the dimensions are for the clarity of presentation and are shown exaggerated in the Figures.

Accordingly, embodiments of the present invention provide for memory devices and methods for manufacturing such devices that exhibit increased program and erase performance. Other embodiments provide for improved gate controllability as memory devices are scaled beyond the 4× technology node. Still other embodiments provide for reduced back gate injection during erase operations as devices are scaled beyond the 4× technology node.

Figure 1:
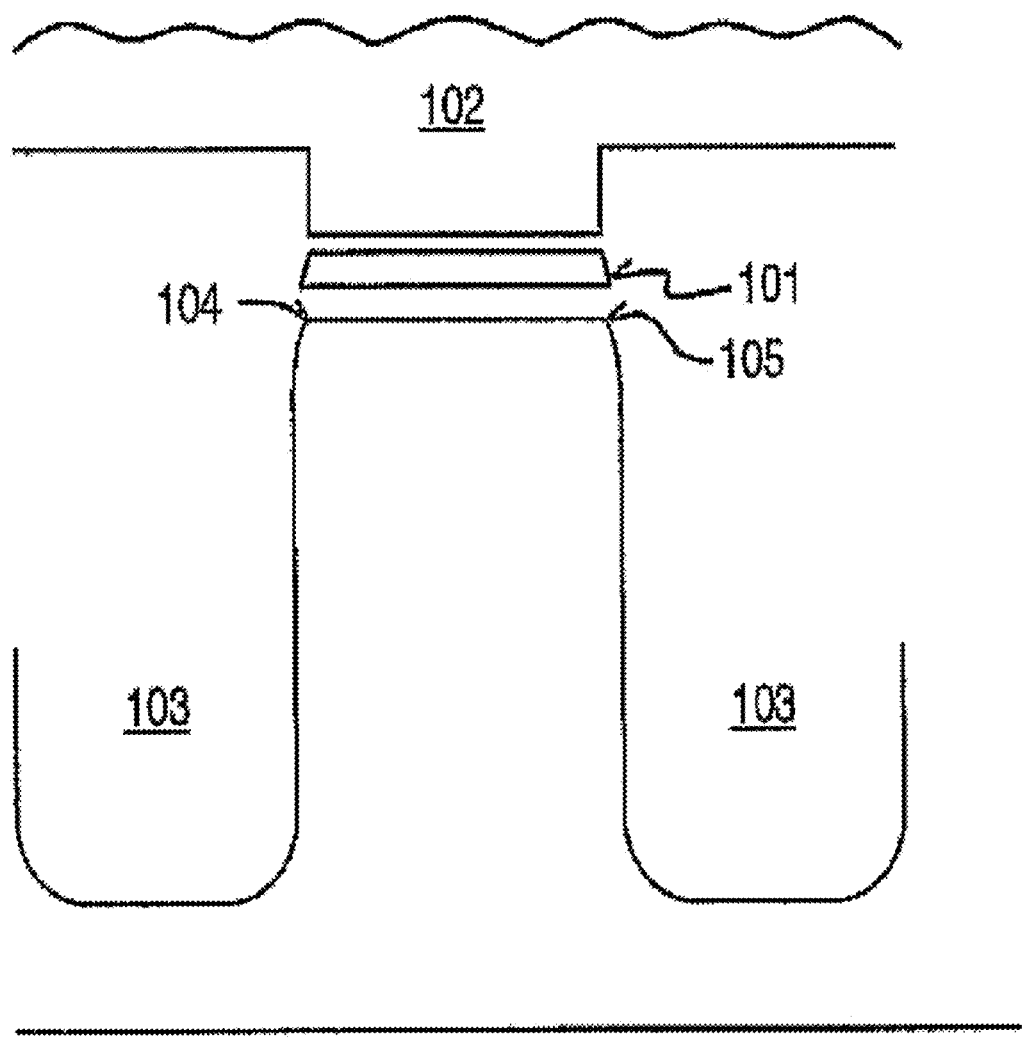
FIG. 1 shows a conventional memory cell.
Figure 2:
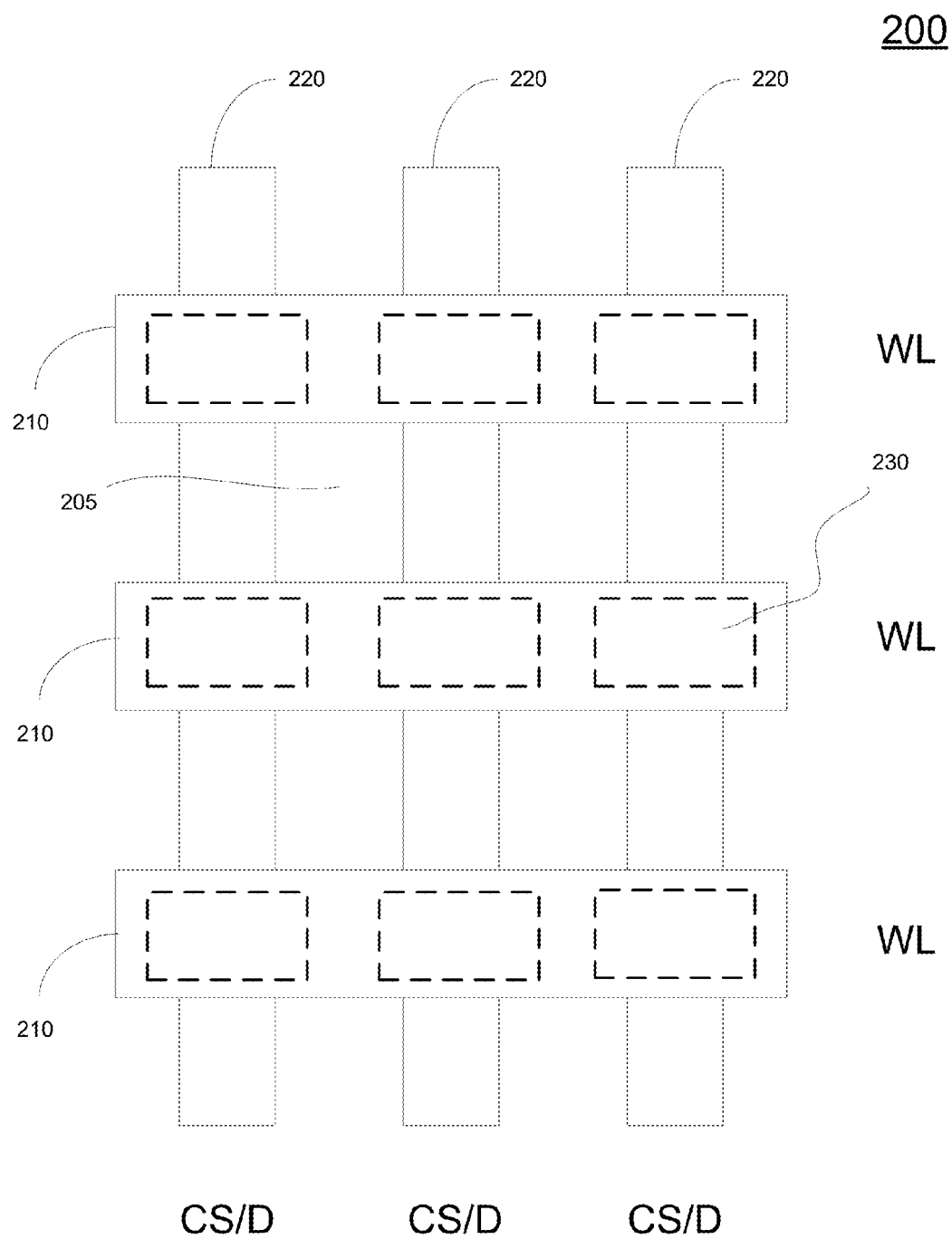
FIG. 2 shows a partial top plan view of an embodiment of a core section of memory, in accordance with one embodiment of the present disclosure.

FIG. 2 shows a partial top plan view of core memory 200. Core memory 200 may include arrayed core memory cells. Core section 200 includes core polysilicon lines 210, and conductive regions (not shown). Portions of core polysilicon lines 210 are coupled to the gates of individual memory cells (not shown in FIG. 2) and can be configured as a word line, a source select gate line, and/or a drain select gate line. Portions of conductive regions can include, for example, p-type and/or n-type doped regions of substrate 205 for forming core source/drain (CSD) regions and/or conductive lines 220. For example, conductive regions can form portions of bit lines and/or other signal lines. Also, in some embodiments, individual conductive regions extend at least partially underneath individual core polysilicon lines 210.

The core section 200 illustrates a plurality of memory cells (e.g., flash memory cells). Each memory cell is associated with a charge trapping layer 230 of a charge trapping component. More particularly, each memory cell includes a charge trapping component that includes an oxide-nitride-oxide (ONO) charge trapping structure, or ONO stack. For instance, the ONO stack includes a charge trapping layer 230 disposed between a bottom oxide layer and a top oxide layer. The combination of the bottom silicon oxide layer, the silicon nitride layer 230, and the top silicon oxide layer are capable of trapping charge.

In one embodiment, core memory 200 is arranged in a NOR topology, and individual memory cells can be individually accessed via individual conductive regions 220. In another embodiment, core memory 200 is arranged in a NAND topology, and individual memory cells can be accessed. In other embodiments, hybrid architectures can be employed. For example, core section 200 can be configured to have a portion that is NAND-based and another portion that is NOR-based. Also, although not shown in FIG. 2, core section 200 may include any of a variety of interconnect and/or passivation layers, such as dielectric, conductive, or other layers. For example, conductive regions 220 can be positioned beneath a dielectric spacer layer.

Figure 3:
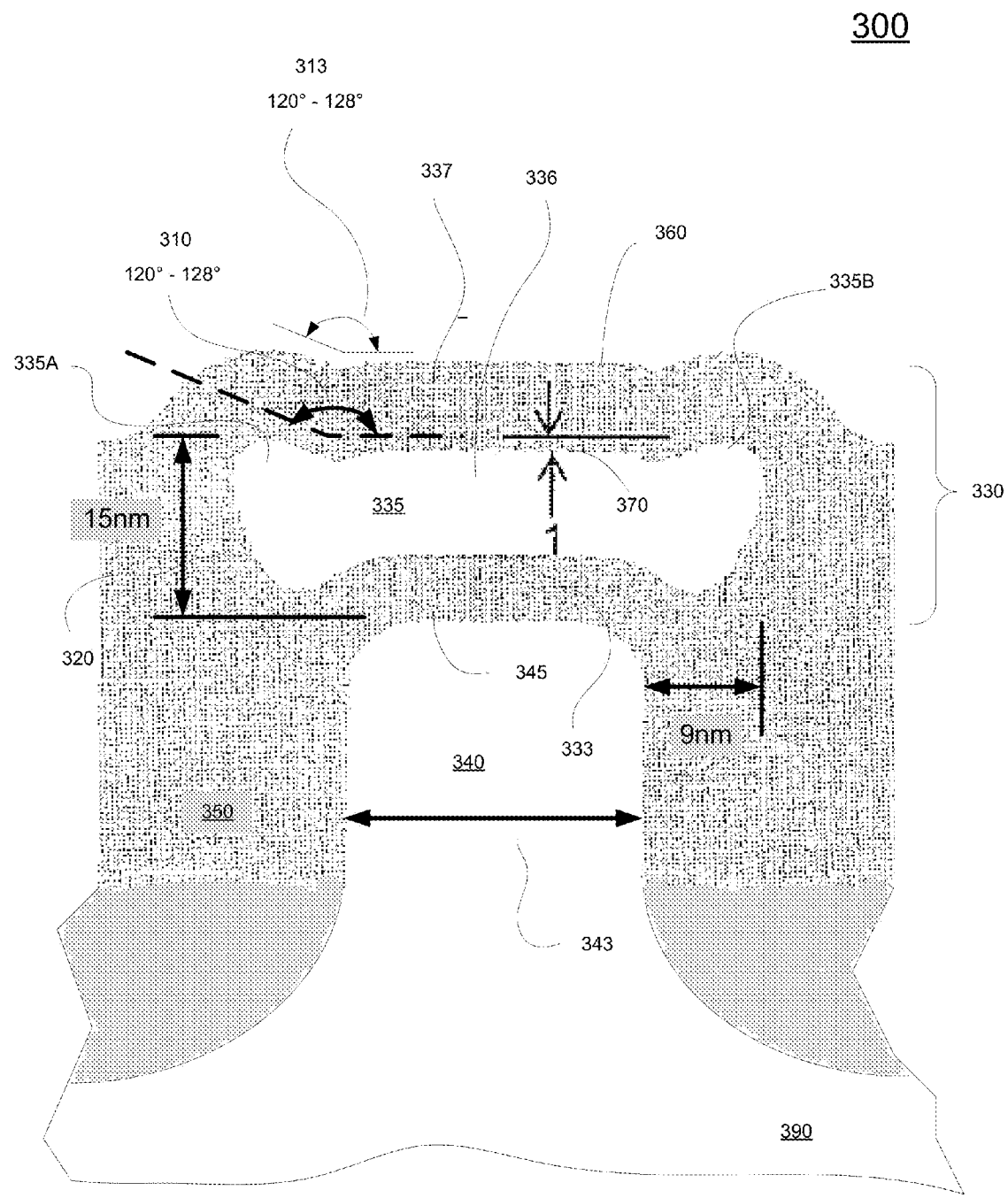
FIG. 3 is an illustration of a memory device including a charge trapping layer extending beyond a source/drain region, in accordance with one embodiment of the present disclosure.

FIG. 3 is a cross-sectional side view of a memory device 300 including a charge trapping layer extending beyond a source/drain region, in accordance with one embodiment of the present disclosure. In particular, memory device 300 is an embodiment of the memory cells in core section 200 of FIG. 2.

Memory cell 300 includes a portion of semiconductor layer or substrate 390. A source/drain region 340 is included within or disposed above the substrate 390, wherein the substrate 390 is fabricated from silicon, silicon based components, or other known semiconductor materials. At least one shallow trench 350 is located adjacent to the source/drain region 340 to provide isolation of memory cell 300. A charge trapping component 330 is disposed over a top surface 345 of an active region 340. The charge trapping component 330 includes a first insulator or bottom oxide 333, a charge trapping layer 335, and a second insulator or top oxide 337. In one embodiment, the charge trapping component comprises an oxide/nitride/oxide (ONO) configuration, wherein the nitride layer 335 (e.g., silicon nitride, silicon rich nitride, or multiple layers with different percentages of silicon content) acts as the charge storing layer, and is typically programmed and erased by the tunneling of electrons into and out of this layer 335 via tunneling layer or bottom oxide 333.

As shown in FIG. 3, the charge trapping layer 335 includes a bulk portion 336 and first and second tip portions 335A and 335B. The charge trapping layer 335 extends beyond a width 343 of the source/drain region 340. In one embodiment, the tip portions 335A-B extend beyond a width 343 of the source/drain region 340. For instance, tip portion 335A extends beyond one side of source/drain region 340 and tip portion 335B extends beyond the opposing side of source/drain region 340.

FIG. 3 illustrates various parameters for memory cell 300, in one embodiment. The dimensions provided in FIG. 3 are provided for illustration purposes, and other dimensions that are not shown for the parameters are contemplated for memory cell 300 in other embodiments. As shown in FIG. 3, the charge trapping layer 335 extends beyond the source/drain region 340 (e.g., by approximately 9 nm). In addition, the height 320 of the charge trapping layer above the top surface 345 of source/drain region 340 is approximately 15 nm. More particularly, the formation of tips 335A and 335B in relation to bulk portion 336 is designed to obtain desired edge field effects at the corners of source/drain region thereby promoting increased program and erase operations. Furthermore the distance 370 between the top of the tips 335A and/or B of charge trapping layer 335 and the surface 370 of bulk portion 336 is approximately 1 nm.

Additionally, memory cell 300 includes an angle 310 of the charge trapping layer 330 that is formed between the surface 370 of bulk portion 336 and tip 335A and/or 335B. Angle 310 is approximately between 120-128 degrees. As shown, angle 310 is tapered and obtuse, and helps to form a less sharp profile when forming additional layers (e.g., top oxide layer 337 and polysilicon gate structure[not shown]) above the charge trapping layer 330. For instance, angle 313 is formed within the top oxide layer 337 and is similar in dimensions to angle 310. Top oxide layer 337 is formed below the polysilicon gate structure (not shown), and surface 360 of top oxide layer 337 forms an interface between the top oxide layer 337 and bottom profile of polysilicon gate structure (not shown).

As such, the rounded and extended tips 335A and 335B in combination with the tapered and obtuse angles 310 and 313 provide for a wider, rounder and less sharp profile for the bottom profile (not shown) of the polysilicon gate structure that is disposed over top oxide layer 337. Surface 360 of top oxide layer 337 defines an interface with the bottom profile (not shown) of the polysilicon gate structure (also not shown). This provides for better controllability of the operation of the charge trapping layer 335 as influenced by the polysilicon gate structure. More particularly, in one embodiment because the tips 335A-B are designed not to protrude greatly into the polysilicon of gate structure (e.g., distance 370 is negative or minimized), it ensures that the polysilicon gate structure near the tips 335A-B is close to the source/drain region 340. This closeness ensures that an electric field is uniform or mostly uniform over the entire region occupied by the bottom or tunneling oxide 333, which in turn provides for uniform flow of electrons into and out of charge trapping layer 335 via bottom oxide 333.

Figure 4:
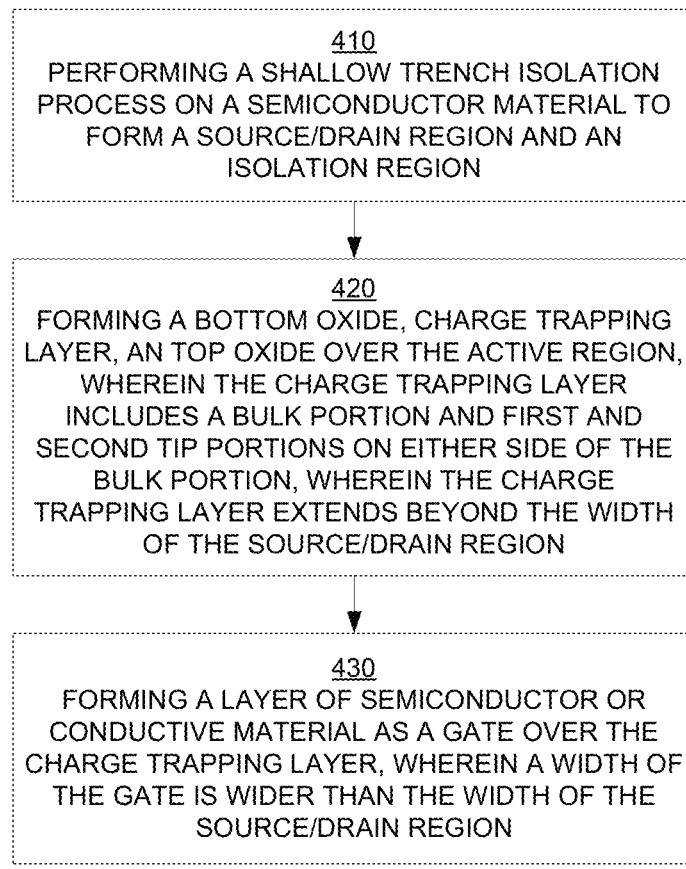
FIG. 4 is a flow diagram illustrating a method of fabricating a memory device including a charge trapping layer configured with tips extending beyond a source/drain region, in accordance with one embodiment of the present disclosure.

FIG. 4 is a flow diagram 400 illustrating a method of fabricating a memory device including a charge trapping layer extending beyond a source/drain region, in accordance with one embodiment of the present disclosure. Generally, the method outlined in flow diagram 400 provides for the manufacture of a self-aligned memory device having a charge trapping layer that extend beyond a source/drain region. For instance, flow diagram 40 can be used to fabricate the memory cells shown in FIGS. 2, 5, 6, and 9.

At 410, a shallow trench isolation process is performed on a semiconductor material. This process is used to form a source/drain region and an isolation region (e.g., STI). More particularly, this process is used to form a plurality of source/drain regions and a plurality of isolation regions to form memory cells in core memory.

At 420, a bottom oxide, charge trapping layer, and top oxide is formed over the source/drain region. The charge trapping layer includes a bulk portion, and first and second tip portions formed on either side of the bulk portion. The bulk portion and tip portions are formed simultaneously in the same step. More specifically, the tip portions are located on opposing sides of the charge trapping layer, and also are located on either side of the source/drain region. That is, in one embodiment, the charge trapping layer extends beyond the width of the source/drain region, as is shown in FIG. 3.

At 430, a layer of semiconductor or conductive material is formed over the charge trapping layer. This material functions as the gate which is used to control the flow of electrons into and out of the charge trapping layer from the source/drain region. In particular, the width of the gate is wider than the width of the source/drain region. More particularly, the width of the bottom profile of the gate is wider than the width of the source/drain region.

More particularly, the formation of the first and second wing portions and their extensions beyond the underlying source/drain region is accomplished through a bottom oxide pre-clean process. For instance, an STI fill is performed after the source/drain regions and the STI regions are formed during the STI formation process. Exemplary steps include growing a barrier oxide on a silicon substrate. A core source/drain mask is optionally patterned, which is followed by a core STI etch. The STI process defines a number of active or source/drain regions that are separated by trenches, which are filled with insulation material (e.g., oxide) to form the isolation or STI regions.

Figure 5A:
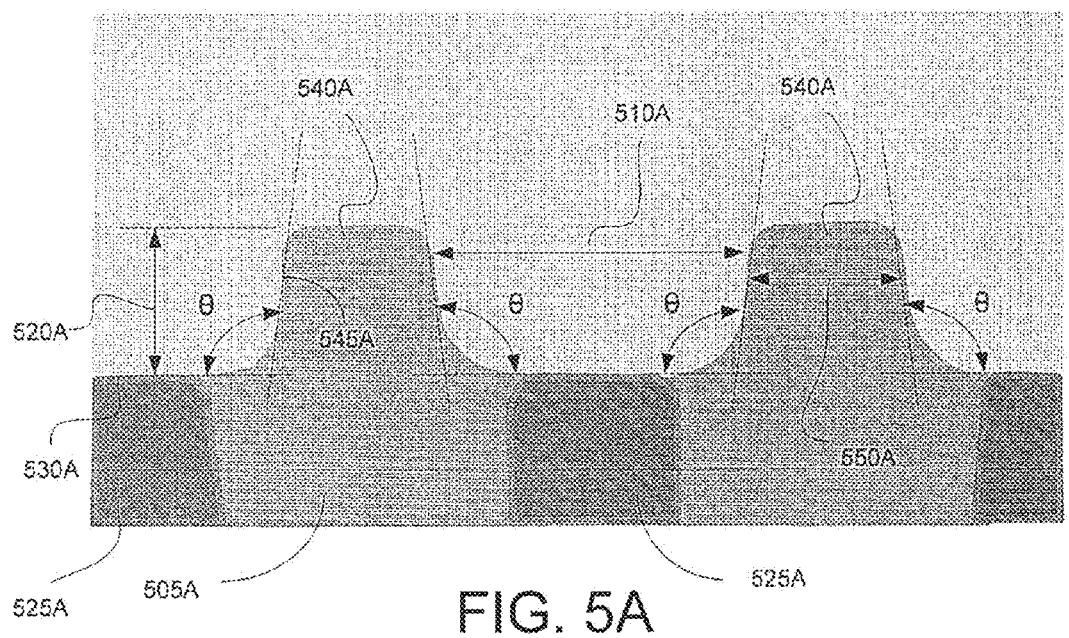
FIGS. 5A-B are illustrations of memory devices during fabrication after bottom oxide pre-clean processes are performed, in accordance with embodiments of the present disclosure.
Figure 5B:
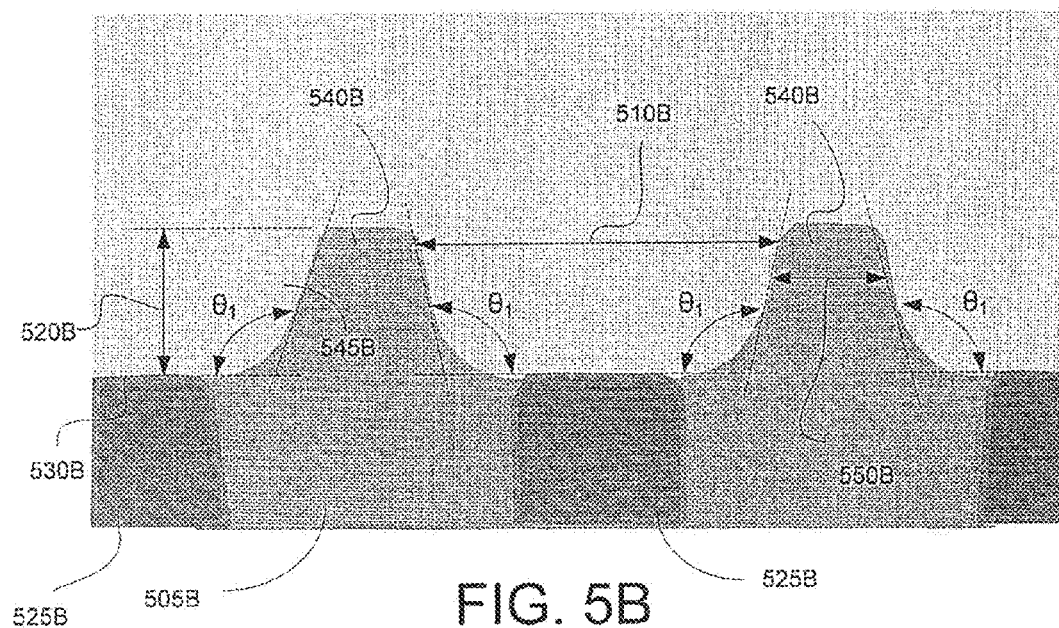

FIGS. 5A-B are illustrations of profiles of memory devices taken after the STI etch and an STI fill have been performed. In addition, a bottom oxide pre-clean step is performed in preparation of the formation of the bottom oxide and charge trapping layer. Subsequent steps include formation of the top oxide and polysilicon gate structure. More particularly, FIGS. 5A and 5B show the widening gap between STI mesas 540 used to form a wider charge trapping component and a wider polysilicon gate bottom profile.

As shown, FIG. 5A is an illustration of a profile 500A of one or more memory devices taken after performing a bottom oxide pre-clean process during fabrication of a memory device. In particular, one or more STI mesas 540A are modulated by a bottom oxide pre-clean process. For example, an STI fill step is performed, wherein insulator material is used to fill in the trench 505A. The trench fill may be polished back, and a sacrificial oxide layer optionally may be deposited. The remaining oxide layer on the source/drain region 525A is removed by a bottom oxide pre-clean step to form the STI mesas 540A. The pre-clean performed to remove oxide may be accomplished, for example, by means of wet or dry etch, sputtering, plasma techniques, or by other means.

Profile 500A illustrates a distance 510A between STI mesas 540A. Also, profile 500A illustrates a height 520A of an STI mesa 540A. In addition, profile 500A illustrates a width 550A of STI mesa 540A. The lengths of distance 510A and height 520A are dependent on how long the bottom oxide pre-clean process is performed during the formation of the memory devices in profile 500A. In addition, angle θ illustrates the angle formed between a top surface 530A of an underlying source/drain region 525A and a side 545A of STI mesa 540A.

Also, FIG. 5B is an image of an STI profile 500B taken after performing a more extensive bottom oxide pre-clean process than the bottom oxide pre-clean process shown in FIG. 5A, both of which are used during the fabrication of one or more memory devices. The bottom oxide pre-clean process in FIG. 5B lays the foundation for the formation of the charge trapping layer (not shown) that extends beyond a source/drain region 525B, in accordance with one embodiment of the present disclosure. The pre-clean performed to remove oxide may be accomplished, for example, by means of wet or dry etch, sputtering, plasma techniques, or by other means. In particular, the profile 500B is created after fabrication steps are performed, to include in part, an STI etch, an STI fill, a sacrificial oxide deposition with or without the sacrificial oxide, and bottom oxide pre-clean steps.

Profile 500B illustrates a distance 510B between STI mesas 540B. Also, profile 500B illustrates a height 520B of an STI mesa 540B. In addition, profile 500B illustrates a width 550B of STI mesa 540B. The lengths of distance 510B and height 520B are dependent on how long the bottom oxide pre-clean process is performed during the formation of the memory devices in profile 500B. In addition, angle $\theta_1$ illustrates the angle formed between a top surface 530B of an underlying source/drain region 525B and a side 545B of STI mesa 540B.

The differences between profiles 500B and 500A are dramatic, in that the profile 500B shows a greater distance between STI mesas 540B, and corresponding thinner and shorter STI mesas 540B. That is the bottom oxide pre-clean process performed to form profile 500B provides for additional removal of material in the STI mesa in lateral and vertical directions. First, FIG. 5B shows an increase in the gap 510B between STI mesas 540B over the gap 510A in FIG. 5A. Specifically, the distance 510B between STI mesas 540B in profile 500B is greater than the distance 510A between STI mesas 540A in profile 500A. Second, FIG. 5B shows a reduction in height 520B of STI mesa 540B when compared to the height 520A in FIG. 5A. Specifically, height 520B of STI mesa 540B is lower than the height 520A of STI mesa 540A of profile 500A. Third, FIG. 5B shows a reduction in the width 550B of STI mesa 540B when compared to the width 550A in FIG. 5A. In particular, width 550B of STI mesa 540B of profile 500B is less than the width 550A of STI mesa 540A of profile 500A. As such, the wider gap 510B between STI mesas 540B as shown in FIG. 5B will result in a wider bottom profile of a corresponding polysilicon gate structure (not shown).

Figure 6A:
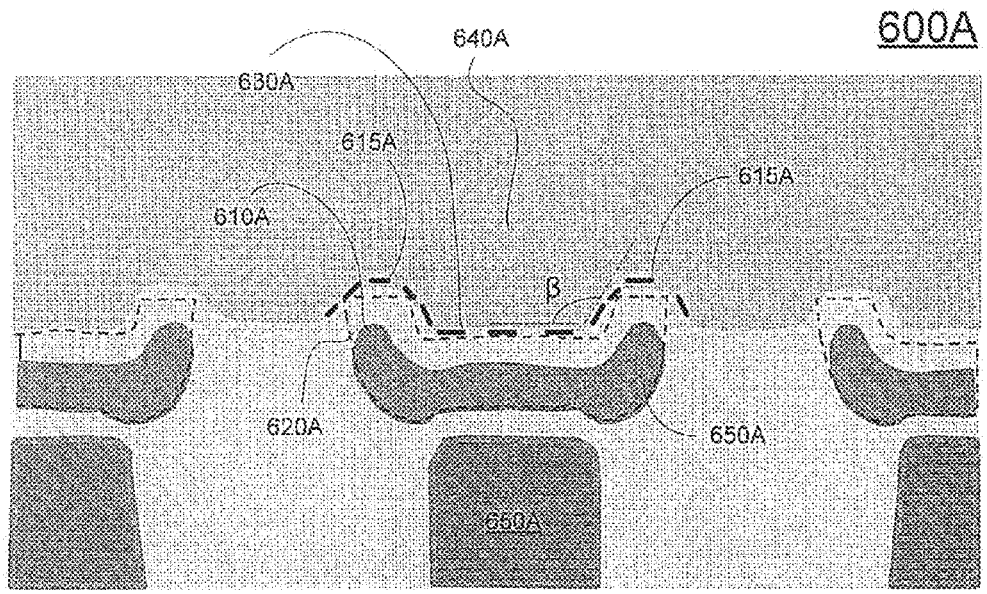
FIG. 6A-B are illustrations of memory devices during fabrication after top-oxide and polysilicon deposition processes are performed during fabrication of memory devices, in accordance with embodiments of the present disclosure.
Figure 6B:
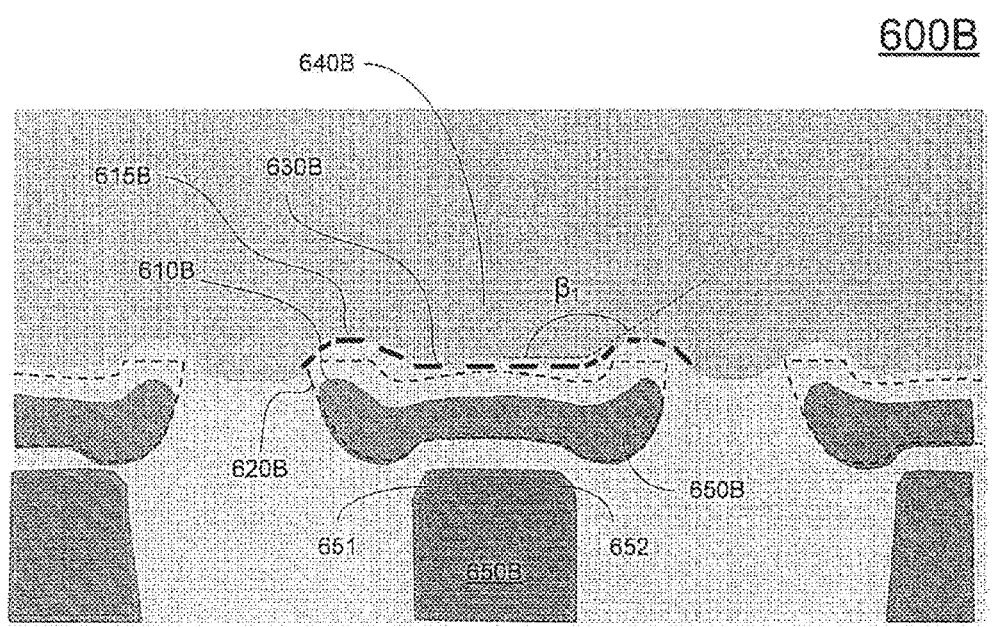

For instance, FIGS. 6A-B are illustrations of memory cells 600A-B after the bottom oxide growth, charge-trapping layer deposition, top oxide and polysilicon gate formation processes have been performed to memory devices shown in profiles 500A-B of FIGS. 5A-B, in accordance with embodiments of the present invention. Specifically, FIG. 6A shows the memory device 600A after the above and additional fabrication steps have been performed on the memory devices shown in profile 500A. FIG. 6B shows a memory device 600B after the above and additional fabrication steps have been performed on the memory devices shown in prolife 500B.

The illustrations in FIGS. 6A and 6B isolate the bottom profiles 630A and 630B of polysilicon gate structures 640A and 640B, respectively. That is, FIG. 6A shows bottom profile 630A of the polysilicon gate structure 640A over the effective outline 620A of the charge trapping layer and top oxide layer of a memory cell 600A. Also, FIG. 6B shows bottom profile 630B of the polysilicon gate structure 640B over the effective outline 620B of the charge trapping layer and top oxide layer of a memory cell 600B. More specifically, FIG. 6B shows the smoothing out of the bottom profile 630B of the gate structure 640B in the improved memory structure of embodiments of the present invention, when compared to the bottom profile 630A of the polysilicon gate structure 640A in FIG. 6A. Additionally, bottom profile 630B of the polysilicon gate structure 640B in the improved memory structure 600B in FIG. 6B is wider than the bottom profile 630A of the gate polysilicon gate structure 640A of the memory structure 600A in FIG. 6A. As such, the bottom profile 630 and the corresponding outline 620B of the top oxide and charge trapping layers of memory cell 600B has more surface area exposed to the source/drain region 650B, when compared to the bottom profile 630A and outline 620A of the top oxide and charge trapping layers of memory cell 600A.

More particularly, FIG. 6A is an illustration of a memory cell 600A including tip 610A of a charge trapping layer 650A that was formed, in part, through a bottom oxide pre-clean process, and showing sharper and more defined corners 615 of the bottom profile 630A of the polysilicon gate structure 640A, in accordance with one embodiment of the present disclosure. In particular, tip 610A protrudes into the polysilicon gate structure 640A. In addition, the bottom profile 630A of the polysilicon gate structure 640A at corner 615A is correspondingly sharp to match the protrusion of tip 610A. Also, the vertex of angle β is sharp, which detrimentally enhances the proximate electric field and negatively promotes back gate injection at the vertex. As such, the corner 615A of the bottom profile 630A of the polysilicon gate structure 640A near tip 610A extends deep into the polysilicon, thereby decreasing the surface area of bottom profile 630A exposed to the source/drain region 650A.

Also, FIG. 6B is an illustration of a memory cell 600B showing a tip 610B of a charge trapping layer 650B that was formed, in part, using an alternative bottom oxide pre-clean process and showing rounded corners 615B of the bottom profile 630B of the polysilicon gate structure 640B, in accordance with one embodiment of the present disclosure. More particularly, the bottom oxide pre-clean process used to form the memory device 600B in FIG. 6B is more extensive and/or of a longer duration than the bottom oxide pre-clean process used to form the memory device 600A in FIG. 6A.

In particular, tip 610B of a charge trapping layer 650B smoothly and barely protrudes into the polysilicon gate structure 640B formed above the outline 620B defining the top oxide and charge trapping layer 650B of the memory device 600B. Furthermore, the more extensive bottom oxide pre-clean process used in the formation of memory device 600B in FIG. 6B provides for flattened and widened formation of the charge trapping layer 650B, wherein the charge trapping layer 650B extends beyond the corresponding source/drain region 650B. For instance, tips 610B on either side of the charge trapping layer 650B are rounded and extend beyond a corresponding source/drain region, in one embodiment. As a result, a corner 615B of the bottom profile 630B of the polysilicon gate structure 640A is correspondingly rounded to match the rounded tip 610B.

Also, the vertex of angle $\beta_1$ is obtuse, which greatly reduces the protrusion of tip 610B into the polysilicon gate structure 640B. This in turn reduces the electric field at the angle $\beta_1$. Additionally, both of these characteristics aid in increasing the surface area of bottom profile 630B that is exposed to the source/drain region 650B. For instance, the tips 610B of charge trapping layer 650B have small enough profiles to wrap the bottom profile 630B of the polysilicon gate structure 640B further around the corners 651 and 652 of the source/drain region 650B. As such, the corner 615B of bottom profile 630B of polysilicon gate structure 630B is correspondingly rounded. This promotes better controllability of the injection and removal of electrons from the charge trapping layer 650B.

Specifically, the wider and rounder bottom profile 630B of polysilicon gate structure 640B provides for better controllability of the injection and removal of electrons from the charge trapping layer 650B. In addition, the rounded polysilicon gate structure 640B provides for reduced back gate injection, especially during the erase process. As shown in FIG. 6A, a sharper angle β of the bottom profile 630A promotes back gate injection due to high field enhancements allowing for electron leakage into the charge trapping layer 650A from the polysilicon gate structure 640A. On the other hand, the rounded corner 630B of the bottom profile 630B of the polysilicon gate structure 640B provides for reduced field enhancements in the corners 651 and 652 of the source/drain region 650B due to the more uniform distribution of the electrical field pattern across interfaces with the charge trapping layer 650B, which results in reduced back gate injection.

Figure 7:
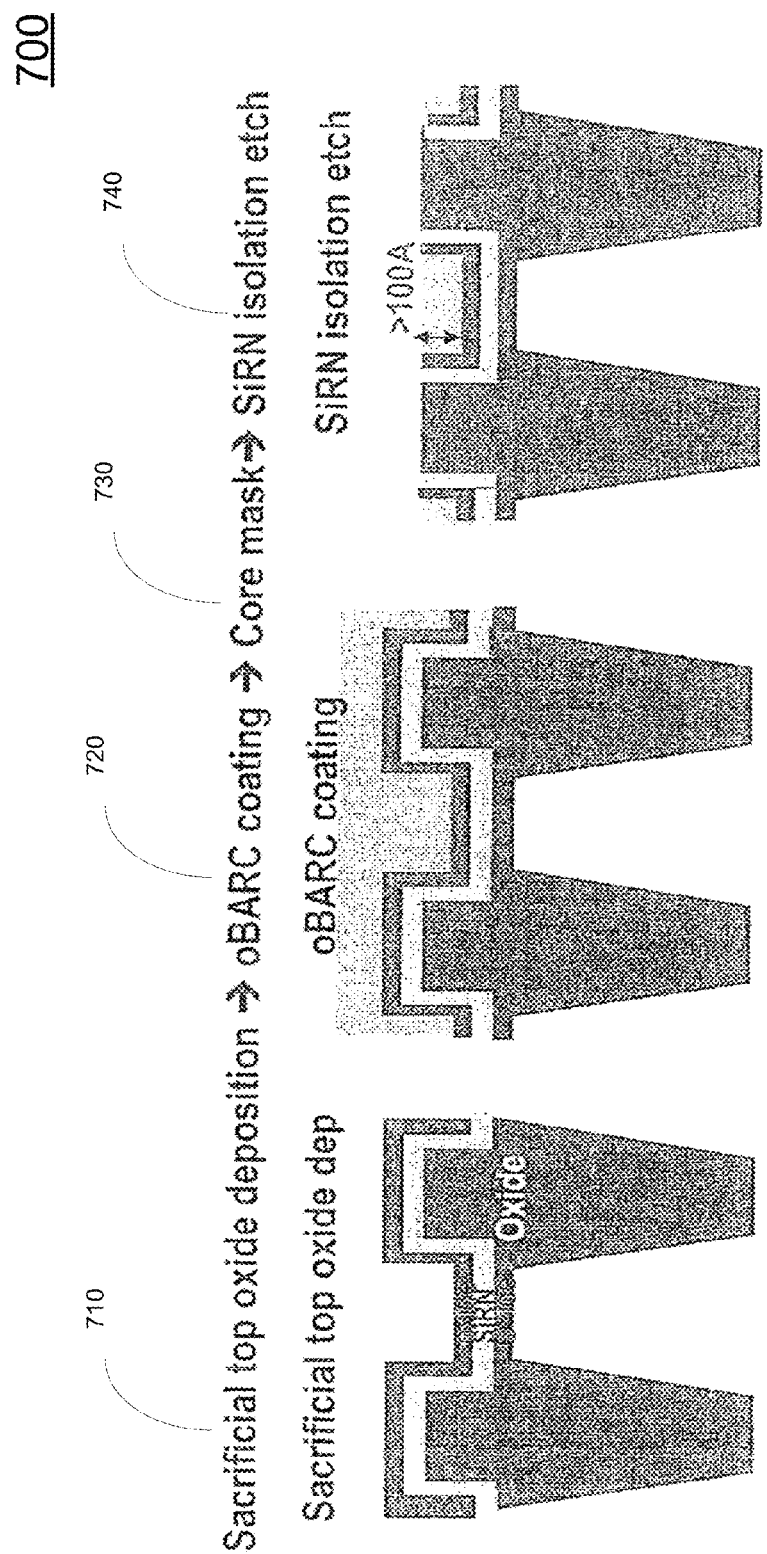
FIG. 7 is a process flow illustrating the isolation of a charge trapping layer of one memory cell from other charge trapping layers of other memory cells, in accordance with one embodiment of the present disclosure.

FIG. 7 is a process flow 700 illustrating the isolation of a charge trapping layer of one memory cell from other charge trapping layers of other memory cells, in accordance with one embodiment of the present disclosure. The operations in process flow 700 are performed after the STI isolation process is completed, for example. In particular, during the formation of a charge trapping component, at 710, a sacrificial oxide layer is deposited. The charge trapping component includes a bottom oxide layer, a charge trapping nitride layer (e.g., SiRN or multiple layers of nitride with varying nitride compositions), and a sacrificial oxide layer that is later removed. At 720, a planarization layer (e.g., organic bottom anti-reflective coating) is deposited over the sacrificial top oxide. At 730, a core mask is laid. At 740, the planarization layer is removed to separate the charge trapping (e.g., SiRN) layers for each memory cell. Thereafter, removal of the sacrificial top oxide layer can also be performed in preparation of the deposition of the top oxide layer.

FIGS. 8A-B are diagrams of a memory cell including a curved core source/drain region, in accordance with one embodiment of the present disclosure. That is, the source/drain region comprises a top surface (e.g., surface 845) that does not just have rounded edges, but comprises in one embodiment, a rounded shape, and in another embodiment, a substantially, and uniformly rounded shape.

For instance, FIG. 8A is a cross section of core memory 800A illustrating multiple memory cells. In particular, core memory 800A includes a plurality of source/drain regions 810. For illustration, a description of memory cell 800B is representative of the memory cells in core memory 800A. Memory cell 800B includes source/drain region 810, and STI regions 820 that isolate memory cell 800B. As shown, memory cell 800B includes a charge trapping component 815, and a polysilicon gate structure disposed over charge trapping component 815. More particularly, source/drain region 810 is rounded at its interface with a charge trapping component 815.

Various exemplary dimensions are shown providing an illustration of one implementation of the memory cells in core memory 800A. For instance, the width 811 of the source/drain region is approximately in the range of 10-40 nm. In addition, the width 821 of the STI region 820 is approximately in the range of 10-70 nm, which promotes the widening, flattening, and rounding of the profile of the charge trapping component 815 as well as the bottom profile of the polysilicon gate structure disposed over the charge trapping component 815. To illustrate the shortened height, a height 829 dimension for the charge trapping component 815 is approximately in the range of 20-100 nm. Further, the distance 827 between charge trapping components between two memory cells is approximately in the range of 5-20 nm.

FIG. 8B is a cross-sectional side view of memory device 800B that illustrates a close-up of the charge trapping component 815, shown in core memory 800A of FIG. 8A. In one embodiment, the charge trapping component 815 comprises an oxide/nitride/oxide (ONO) configuration, wherein the nitride layer 850 (e.g., silicon nitride, silicon rich nitride, or multiple layers with different percentages of silicon content) acts as the charge storing layer, and is typically programmed and erased by the tunneling of electrons into and out of this layer 850 via tunneling layer or bottom oxide 860. As shown, charge trapping component 815 includes a bottom oxide layer 860 disposed over a source/drain region 840, and a charge trapping layer 850 disposed between the bottom tunneling oxide 860 and a top oxide 870.

Optionally, charge trapping layer 850 is configured with tips 850A and 850B extending beyond the source/drain region 840, wherein the tip configuration was previously described in relation to FIGS. 3-7, in accordance with embodiments of the present disclosure. Also, charge trapping layer 850 includes a bulk portion 854 between the tip portions 850A and 850B, wherein the bulk portion 854 and tip portion are formed simultaneously. Further, the distance or height 855 between the surface of the bulk portion 854 and the top of tip 850B is of a dimension consistent with the promotion of the formation of an obtuse and flattened bottom profile of the polysilicon gate structure 880. For instance, the height 855 may be of a positive value, where the top of tip 850B is higher than the surface of the bulk portion 854, in one embodiment. In another embodiment, the height 855 may be negative, wherein the top of tip 850B is lower than the surface of the bulk portion 854, as is shown in FIG. 8B.

Also, a top surface 845 of the source/drain region 840 is rounded, such that surface 845 provides a rounded interface between the source/drain region 840 and the bottom oxide 860. For instance, the source/drain region 840 comprises a top surface 845 that is rounded, in that the corners and/or edges are rounded, in one embodiment. In another embodiment, the source/drain region 840 comprises a top surface 845 that is substantially, continuously, and uniformly rounded shape. Formation of the rounded top surface 845 is described in relation to FIGS. 9A-B below.

Furthermore, a profile of the charge trapping structure 815 is also rounded in conformance with the rounded top surface 845 of the source/drain region 840. In particular, a profile of the bottom oxide insulation layer 860, the charge trapping layer 850, and the top oxide insulation layer 870 is also rounded, as is shown in FIG. 8B. That is, the interface between the source/drain region 840 and the charge trapping component is also rounded. More specifically, the ONO stack including the bottom oxide insulation layer 860, charge trapping layer 850, and top oxide insulation layer 870 is rounded and conforms to the surface 845 of the source/drain region 840. Also, the interface between the charge trapping component and the bottom profile of the polysilicon gate structure is also rounded. As such, the polysilicon gate structure includes an obtuse and rounded bottom profile formed throughout the width of the gate structure, wherein the bottom profile is rounded in conformance with the rounded interface and profile of the charge trapping component 815.

These rounded formations and interfaces between the source/drain region, charge trapping component, and bottom profile of the polysilicon gate structure provide for a more uniform distribution of the electrical field, especially through the bottom tunnel oxide layer 860 during erase and program operations. This provides for better controllability of the electron flow during the erase and program operations and reduced back gate injection through the top oxide 870. In addition, the surface area of the interface between the source/drain region and the bottom oxide layer is increased over an interface with a flat topped source/drain region. This increases the channel width of the memory cell, thereby increasing current flow and drive current for a given voltage condition.

Figure 9A:
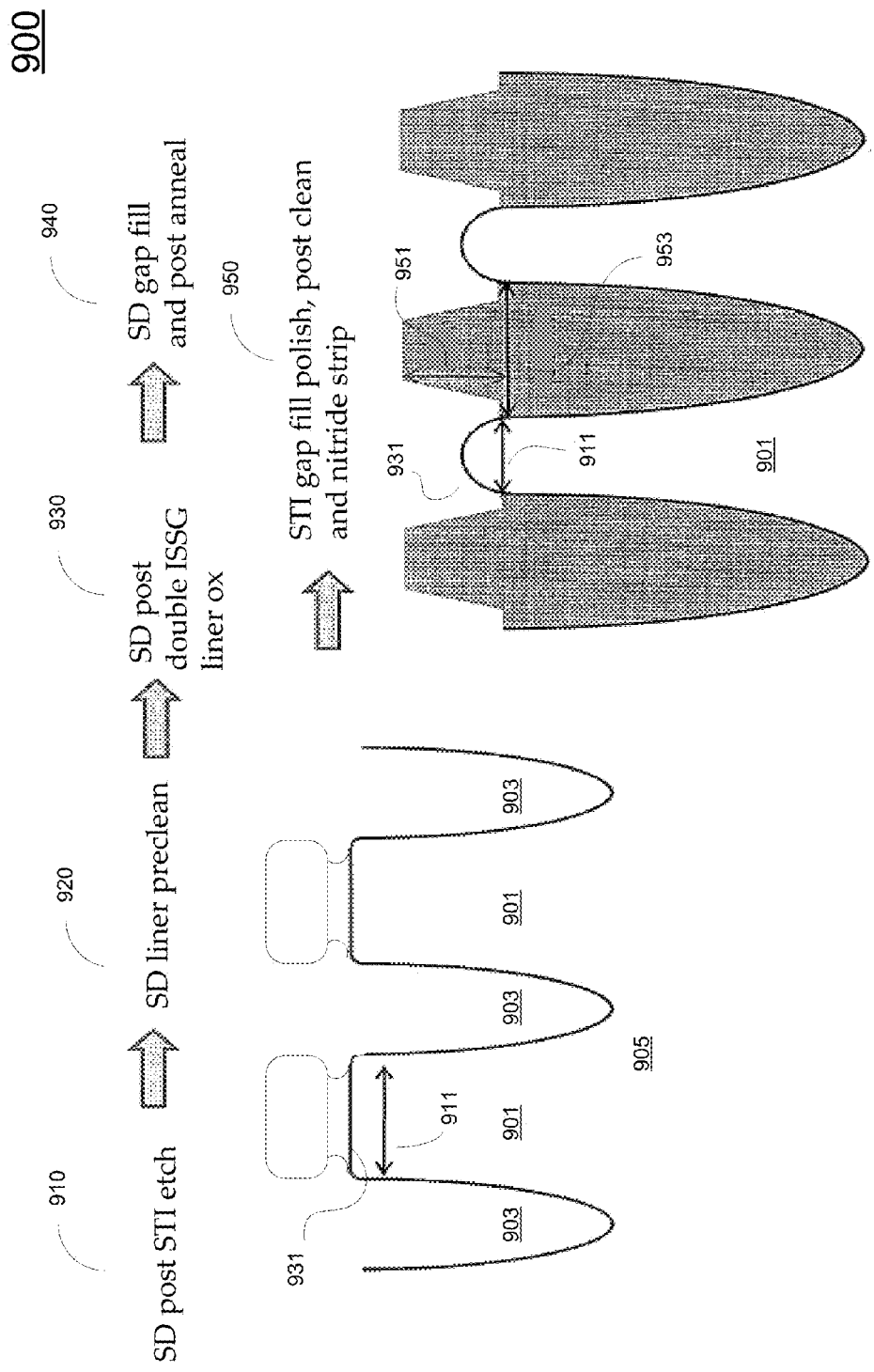
FIGS. 9A-B illustrate a process flow used for fabricating a memory cell including a curved core source/drain region, to include multiple liner oxide growth and stripping steps, in accordance with one embodiment of the present disclosure.
Figure 9B:
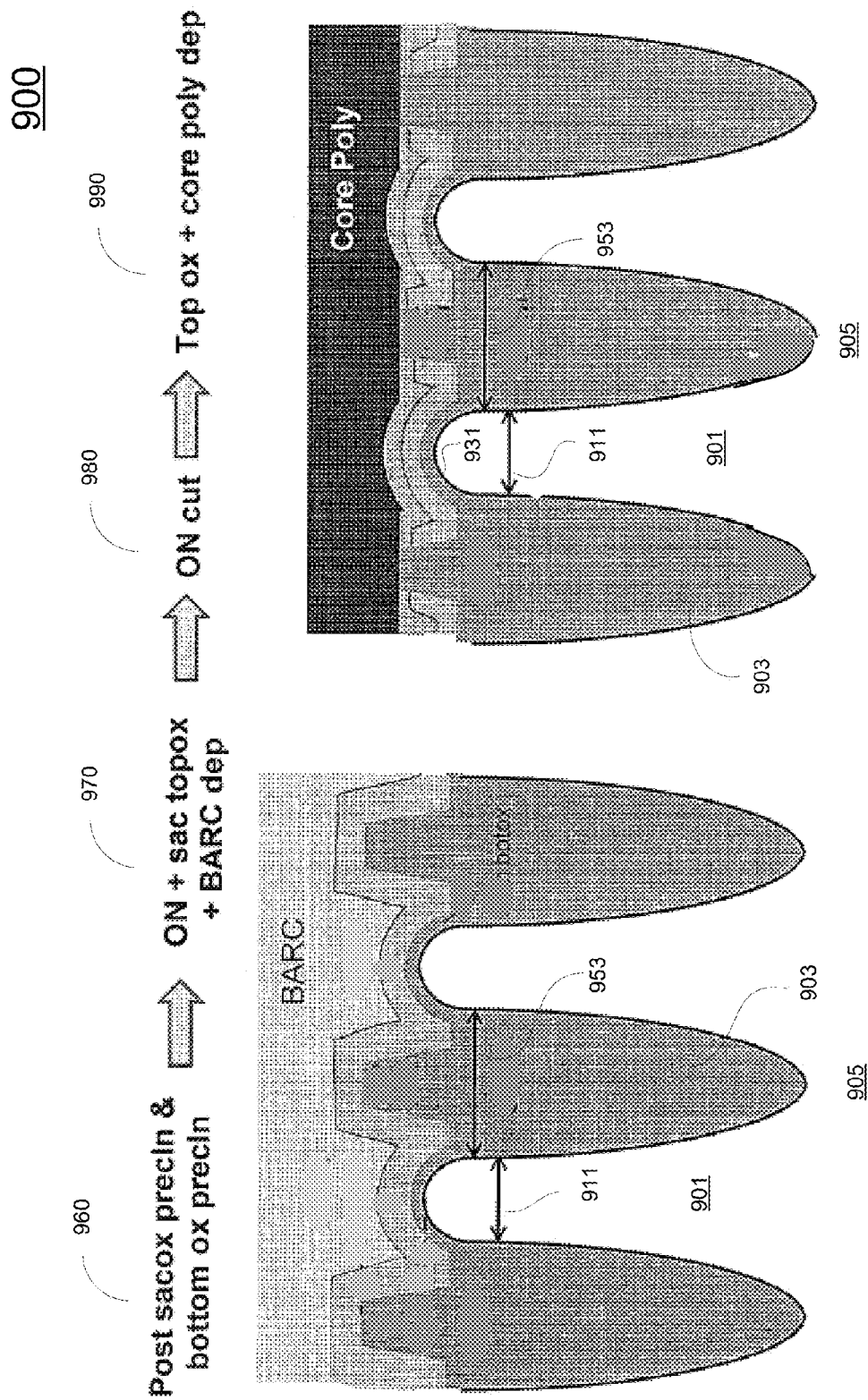

FIGS. 9A-B illustrate a process flow 900 used for fabricating a memory cell including a continuously curved or rounded core source/drain region, to include multiple liner oxide growth and stripping steps, in accordance with one embodiment of the present disclosure. In particular, the process beginning in FIG. 9A occurs after the STI etch has been performed during an STI formation process. As shown, the STI formation process is performed before the charge trapping and other top layers are formed. The STI process defines one or more active or source/drain regions 901 isolated by trenches 903 over a common substrate 905. At 920, a liner pre-clean process is performed, which exposes the corners of the source/drain region 901 for rounding in subsequent steps. At 930, multiple liner oxide growth and etch processes are performed. These operations round off the source/drain region 901, such that a top surface 931 of the source/drain region 901 is rounded, and reduces the width 911 of the source/drain region 901. For instance, in one implementation, the oxidation and etching process is performed twice in a double ISSG liner oxide operation. The degree of roundness is controlled, in part, by the number of times the liner oxide is grown and etched as well as other parameters defining the growth or deposition and etching processes. After iterations of the oxidation and etching processes, the core source/drain width 911 is further reduced. In another implementation, the source/drain region 901 can also be rounded by other process techniques such as hydrogen annealing, or performing dry etching during the STI etch process, etc. The degree of roundness is controlled, in part, by the ambient pressure, temperature and time in embodiments of the invention. At 940, an STI gap fill and anneal process are performed. The anneal process is to densify filled materials. At 950, after the STI gap fill material is polished, cleaning and stripping steps further reduce the STI pillar height 951 and further increases a width 953 of the STI trench.

Continuing the process flow 900 in FIG. 9B, at 960, sacrificial oxide pre-clean and bottom oxide pre-clean processes are performed. As previously described, the pre-clean processes help to form the flat, wide, and rounded profile of the charge trapping structure, and especially the tips of the charge trapping layer in the charge trapping component. Also, FIG. 9B shows layers and formations of devices in various stages, and include one or more active or source/drain regions 901 isolated by trenches 903 over a common substrate 905. A width 911 of the source/drain regions, and a width 953 of trenches 903 are shown. At 970, a sacrificial oxide layer is deposited on top of the charge trapping structure. The charge trapping structure includes a bottom oxide layer, a charge trapping nitride layer (e.g., SiRN or multiple layers of nitride with varying nitride compositions), and a sacrificial oxide layer that is later removed by a top oxide pre-clean step. A planarization layer is deposited over the sacrificial top oxide. A core is laid, a charge trap layer isolation etch is performed by dry etching, and the BARC coating is removed to separate the SiRN layers for each memory cell in a cutting process in 980. Thereafter, removal of the sacrificial top oxide layer can also be performed in preparation of the deposition of the top oxide layer and core polysilicon for the formation of the gate structure at 990.

Accordingly, embodiments of the present invention provide for memory devices and methods for manufacturing such devices that exhibit obtuse ONO stack and polysilicon gate structure profiles, wherein the charge trapping layer extends beyond the width of the underlying source/drain region. In addition, other embodiments provide for memory devices and methods for manufacturing such devices that exhibit that exhibit source/drain regions under the trapping component, wherein the surface of the source/drain region is continuously rounded.

In the foregoing specification, embodiments of the invention have been described with reference to numerous specific details that may vary from implementation to implementation. Thus, the sole and exclusive indicator of what is, and is intended by the applicant to be, the invention is the set of claims that issue from this application, in the specific form in which such claims issue, including any subsequent correction. Hence, no limitation, element, property, feature, advantage, or attribute that is not expressly recited in a claim should limit the scope of such claim in any way. Accordingly, the specification and drawings are to be regarded in an illustrative rather than a restrictive sense.

What is claimed is:

1. A memory device, comprising:
   a semiconductor layer, including a source/drain region;
   an isolation region;
   a first insulator disposed above said source/drain region;
   a charge trapping layer comprising nitride disposed above said first insulator, wherein said charge trapping layer comprises a bulk portion and a first tip and a second tip on either side of said bulk portion, wherein tops of said first and second tips are above a top surface of said bulk portion and form obtuse angles between said top surface of said bulk portion and said tops of said first and second tips;
   a second insulator disposed above said charge trapping layer; and
   a polysilicon gate structure disposed above said second insulator,
   wherein said source/drain region comprises a top surface that is rounded across a width of the source/drain region.

2. The memory device of claim 1, wherein said polysilicon gate structure includes an obtuse bottom profile including first and second corners corresponding to said first and second tips, wherein said corners are rounded.

3. The memory device of claim 1, wherein said angle ranges between 120 to 125 degrees.

4. The memory device of claim 1, wherein said first and second tips extend beyond said source/drain region.

5. The memory device of claim 1, wherein said top surface is continuously rounded to provide a uniformly rounded shape across the width of said source/drain region.

6. The memory device of claim 5, wherein said first insulator, said charge trapping layer, said second insulator and said polysilicon gate structure are rounded in conformance with the top surface of the source/drain region to increase a width of a channel in the memory device.

7. The memory device of claim 6, wherein a width of said polysilicon gate structure is wider than the width of the source/drain region.

\* \* \* \* \*